(12) United States Patent
Wu et al.

(10) Patent No.: US 7,904,768 B2
(45) Date of Patent: Mar. 8, 2011

(54) PROBING SYSTEM FOR INTEGRATED CIRCUIT DEVICES

(75) Inventors: Cheng-Wen Wu, Hsinchu (TW);
Chih-Tsun Huang, Hsinchu (TW);
Yu-Tsao Hsing, Panchiao (TW)

(73) Assignee: National Tsing Hua University, Hsinchu (TW)

( * ) Notice: Subject to any disclaimer, the term of this patent is extended or adjusted under 35 U.S.C. 154(b) by 299 days.

(21) Appl. No.: 12/114,768

(22) Filed: May 3, 2008

(65) Prior Publication Data

US 2008/0209293 A1 Aug. 28, 2008

Related U.S. Application Data

(63) Continuation-in-part of application No. 11/203,380, filed on Aug. 12, 2005, now abandoned.

(51) Int. Cl.
*G01R 31/28* (2006.01)
(52) U.S. Cl. ........... 714/724; 714/733; 714/30; 714/726; 714/799; 714/734; 324/752; 324/500; 340/635; 455/73; 455/67.11
(58) Field of Classification Search .................. None
See application file for complete search history.

(56) References Cited

U.S. PATENT DOCUMENTS

| | | | | |
|---|---|---|---|---|
| 5,216,361 A * | 6/1993 | Akar et al. | ..................... | 324/761 |
| 6,236,223 B1 * | 5/2001 | Brady et al. | ..................... | 324/765 |
| 6,349,396 B2 * | 2/2002 | Akram | .......................... | 714/724 |
| 6,357,025 B1 * | 3/2002 | Tuttle | ............................. | 714/724 |
| 6,412,086 B1 * | 6/2002 | Friedman et al. | ............. | 714/733 |
| 6,563,301 B2 * | 5/2003 | Gventer | ...................... | 324/158.1 |
| 7,057,518 B2 * | 6/2006 | Schmidt | ........................ | 340/635 |
| 7,181,663 B2 * | 2/2007 | Hildebrant | .................... | 714/726 |
| 2002/0196029 A1 * | 12/2002 | Schmidt | ........................ | 324/500 |
| 2003/0001725 A1 * | 1/2003 | Moore | .......................... | 340/10.3 |
| 2005/0138499 A1 * | 6/2005 | Pileggi et al. | ................. | 714/724 |
| 2006/0132167 A1 * | 6/2006 | Chen | .............................. | 324/765 |
| 2006/0252375 A1 * | 11/2006 | Wu et al. | .................... | 455/67.11 |
| 2006/0282735 A1 * | 12/2006 | Weinraub et al. | ............. | 714/742 |
| 2007/0026809 A1 * | 2/2007 | Zhang et al. | ................ | 455/67.11 |
| 2008/0116910 A1 * | 5/2008 | Hung | ............................. | 324/754 |
| 2008/0152357 A1 * | 6/2008 | Okayasu et al. | .............. | 398/183 |
| 2009/0153158 A1 * | 6/2009 | Dunn et al. | .................... | 324/750 |

FOREIGN PATENT DOCUMENTS

TW 090107845 12/2002
TW 88103352 4/2004

OTHER PUBLICATIONS

Liou et al., "A prototype of a wireless-based test system", 2007, IEEE SOC Conference 2007, pp. 225-228.*

* cited by examiner

Primary Examiner — John P Trimmings
(74) Attorney, Agent, or Firm — Egbert Law Offices PLLC

(57) ABSTRACT

A probing system for an integrated circuit device, which transmits a testing data/signal between an automatic test equipment (ATE) and an integrated circuit device, is disclosed. The probing system includes a test head having a first transceiving module. There is a test station having a test unit coupled to the test head to perform a test operation. A communication module has a second transceiving module configured to exchange data with the first transceiving module in a wireless manner. There is an integrated circuit device having a core circuit being tested, and a test module having a self-test circuit coupled to the core circuit and the communication module for performing the core circuit self-testing.

21 Claims, 9 Drawing Sheets

PROBING SYSTEM FOR INTEGRATED CIRCUIT DEVICES

CROSS-REFERENCE TO RELATED APPLICATIONS

The present application is a continuation-in-part of U.S. application Ser. No. 11/203,380, filed on Aug. 12, 2005 and entitled "PROBING SYSTEM FOR INTEGRATED CIRCUIT DEVICES", presently pending.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

INCORPORATION-BY-REFERENCE OF MATERIALS SUBMITTED ON A COMPACT DISC

Not applicable.

BACKGROUND OF THE INVENTION

1. Field of the Invention

The present invention relates generally to a probing system for integrated circuit device, and more particularly, to a probing system for an integrated circuit device in which testing data is transmitted in a wireless manner.

2. Description of Related Art Including Information Disclosed Under 37 CFR 1.97 and 37 CFR 1.98.

Generally speaking, before an integrated circuit device is packaged, a testing process is performed to check the electrical properties of the integrated circuit device on a wafer. The integrated circuit devices that meet the specifications of the electrical properties are selected for the subsequent packaging process, while others that do not meet the specifications are discarded to cut the packaging cost.

The conventional automatic test equipment (ATE) uses probe tips on a probe card to contact signal pads on a device under test (DUT) so as to form a path for transmitting the probing signal from the ATE to the DUT and transmitting the tested electrical parameters from the DUT to the ATE. However, the operation speed of the integrated circuit device such as the transistor increases continuously as semiconductor fabrication technology improves. The conventional technique uses the probe tip to mechanically probe the DUT and therefore its overall time accuracy (OTA) cannot catch up with the DUT with a highly improved operation speed. Consequently, the conventional ATE obviously cannot be used to probe the electrical property of the high-speed integrated circuit device in the future.

BRIEF SUMMARY OF THE INVENTION

The present invention provides a probing system for an integrated circuit device, which transmits testing data such as the probing signal and the tested electrical parameter etc. between a testing machine including a first transceiving module and an integrated circuit device being tested by the testing machine in a wireless manner.

The integrated circuit device comprises a core circuit, a self-test circuit electrically connected to the core circuit, a controller configured to control the operation of the self-test circuit, and a second transceiving module configured to exchange testing data with the first transceiving module.

In an exemplary embodiment, a probing system for the integrated circuit device comprises a test head having a first transceiving module and a test station having a test unit couple to the test head to perform test operation. The probing system further comprises a communication module having a second transceiving module configured to exchange data with the first transceiving module in a wireless manner. An integrated circuit device has a core circuit being tested. A test module has a self-test circuit coupled to the core circuit and the communication module for performing the core circuit self-testing.

DETAILED DESCRIPTION OF THE INVENTION

Figure 1:
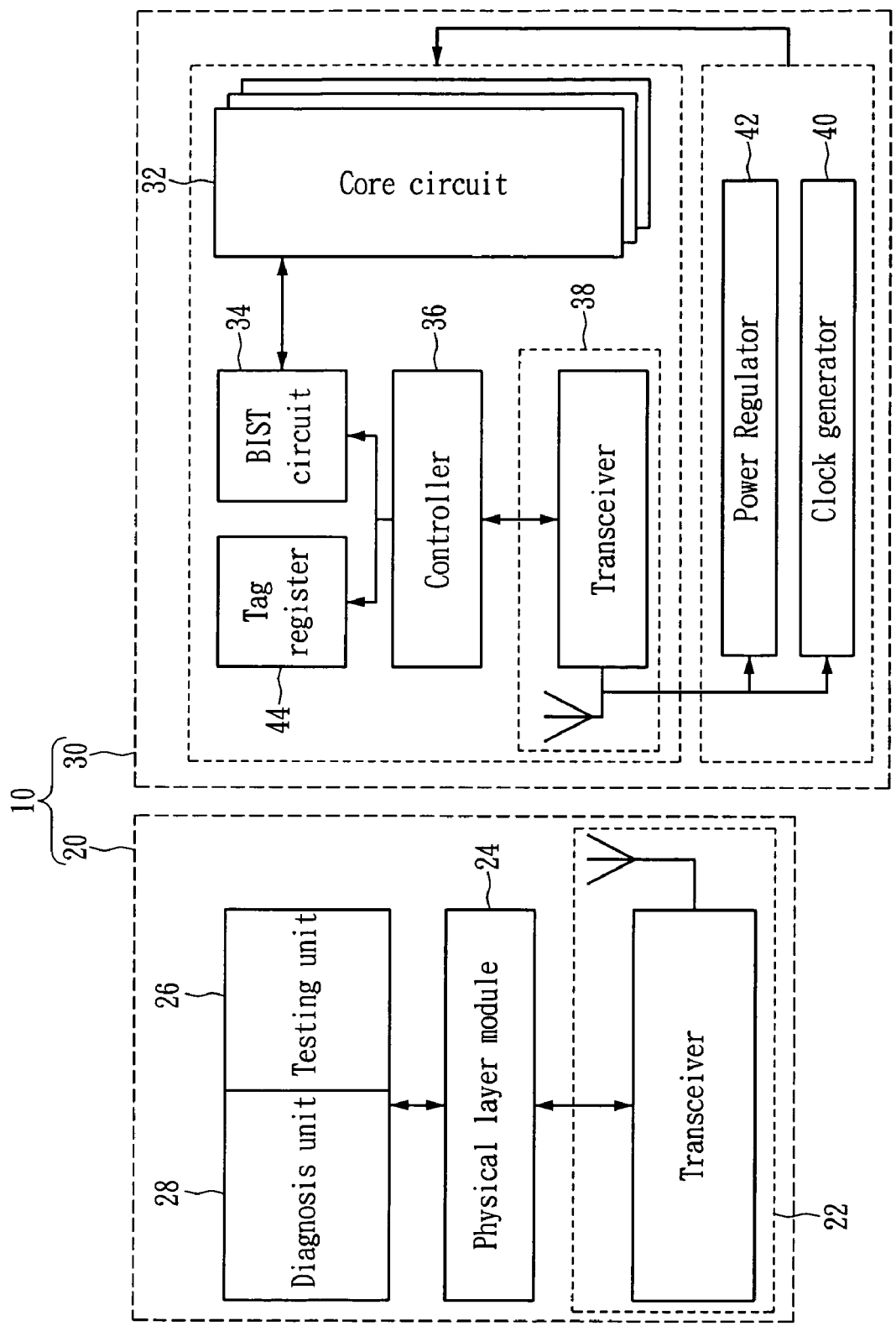
FIG. 1 is a schematic illustration of a probing system for the integrated circuit device according to the first embodiment of the present invention.

FIG. 1 illustrates a probing system 10 for an integrated circuit device according to the first embodiment of the present invention, in which testing data such as the probing signal and the tested electrical parameter is transmitted between a testing machine 20 and an integrated circuit device 30 in a wireless manner. The testing machine 20 comprises a first transceiving module 22, a physical layer module 24 electrically connected to the first transceiving module 22, a testing unit 26 electrically coupled to the physical layer module 24, and a diagnosis unit 28 electrically coupled to the physical layer module 24. The integrated circuit device 30 such as a system on chip (SOC) comprises a core circuit 32, a built-in self-test (BIST) circuit 34 electrically connected to the core circuit 32, a controller 36 configured to control the operation of the BIST circuit 34, and a second transceiving module 38 configured to exchange testing data with the first transceiving module 22. The first transceiving module 22 and the second transceiving module 32 each include a transceiver and an antenna.

The core circuit 32 may be a memory circuit, or a logic circuit, or an analog circuit or may be any combination of two of the above circuits. The core circuit 32 may also include a memory circuit, a logic circuit and an analog circuit. In addition, the inventor of the present application filed two Taiwanese patent applications, No. 088103352 and No. 090107845, disclosing the design technique of the BIST circuit 34. Preferably, the integrated circuit device 30 may further comprise a clock generator 40 electrically connected to the second transceiving module 38 and a power regulator 42 electrically connected to the second transceiving module 38, wherein the testing machine 20 transmits a radio frequency signal by the first transceiving module 22 and the second transceiving module 32 receives the radio frequency signal to drive the power regulator 42 to generate the operation power for the integrated circuit device 30. Further, the integrated circuit device 30 may includes a tag register 44 for storing the identification of the integrated circuit device 30.

During the electrical testing process, the testing machine 20 may transmit a radio frequency signal by the first transceiving module 22. The second transceiving module 32 receives the radio frequency signal to drive the power regulator 42 to generate the operation power for the integrated circuit device 30. The testing unit 26 of the testing machine 20 may also set an identification to an integrated circuit device 30 by the first transceiving module 22, and integrated circuit device 30 stores its own identification in the tag register 44. During the testing process, the testing unit 26 performs a test operation by issuing an activation instruction transmitting to the second transceiving module 32 to activate the BIST circuit 34 to perform the electrical testing of the core circuit 32.

One of the embodiments may have a diagnosis unit 28, receiving testing data transmitted from integrated circuit device 30 after the electrical testing is completed and checking if the integrated circuit device 30 meets the specifications of the electrical properties. The diagnosis unit 28 analyzes the failure cause of the failed device. The physical layer module 24 controls data signals in transmit and receive operations.

Figure 2:
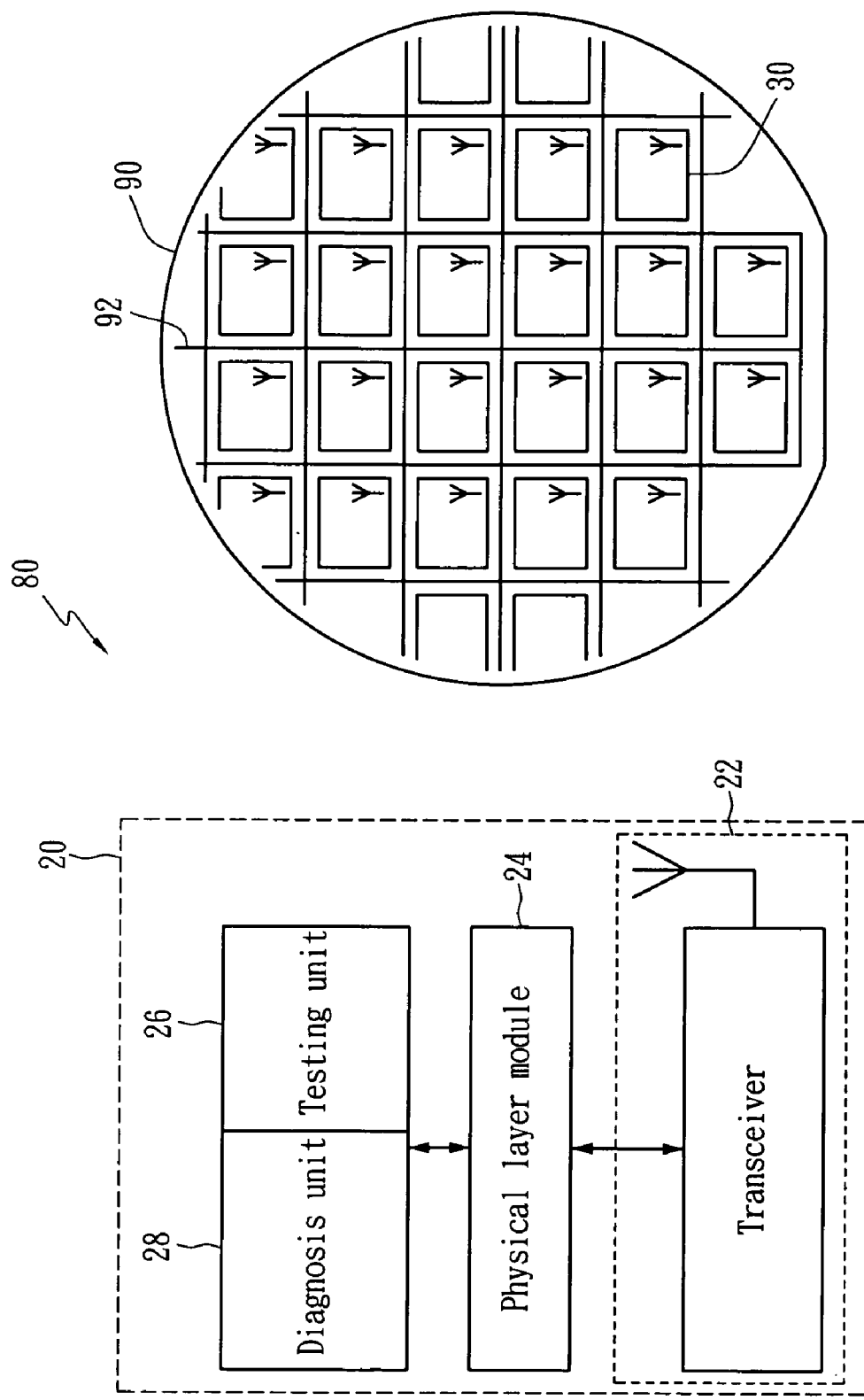
FIG. 2 is a schematic illustration of a probing system for the integrated circuit device according to the second embodiment of the present invention.

FIG. 2 illustrates a probing system 80 for the integrated circuit device according to the second embodiment of the present invention, which is applied to the electrical testing of a plurality of integrated circuit device 30 on a wafer. Particularly, the probing system 80 is applied to the electrical testing of the integrated circuit device 30 at a wafer level. In addition, the wafer 90 may include a power supply line 92 surrounding the integrated circuit device 30, and the integrated circuit device 30 can optionally acquire the operation power from the power supply line 92 rather than from the power generated by the power regulator 42 after receiving the radio frequency signal. Particularly, the power supply line 92 is positioned on the cutting lines of the wafer 90.

Figure 3:
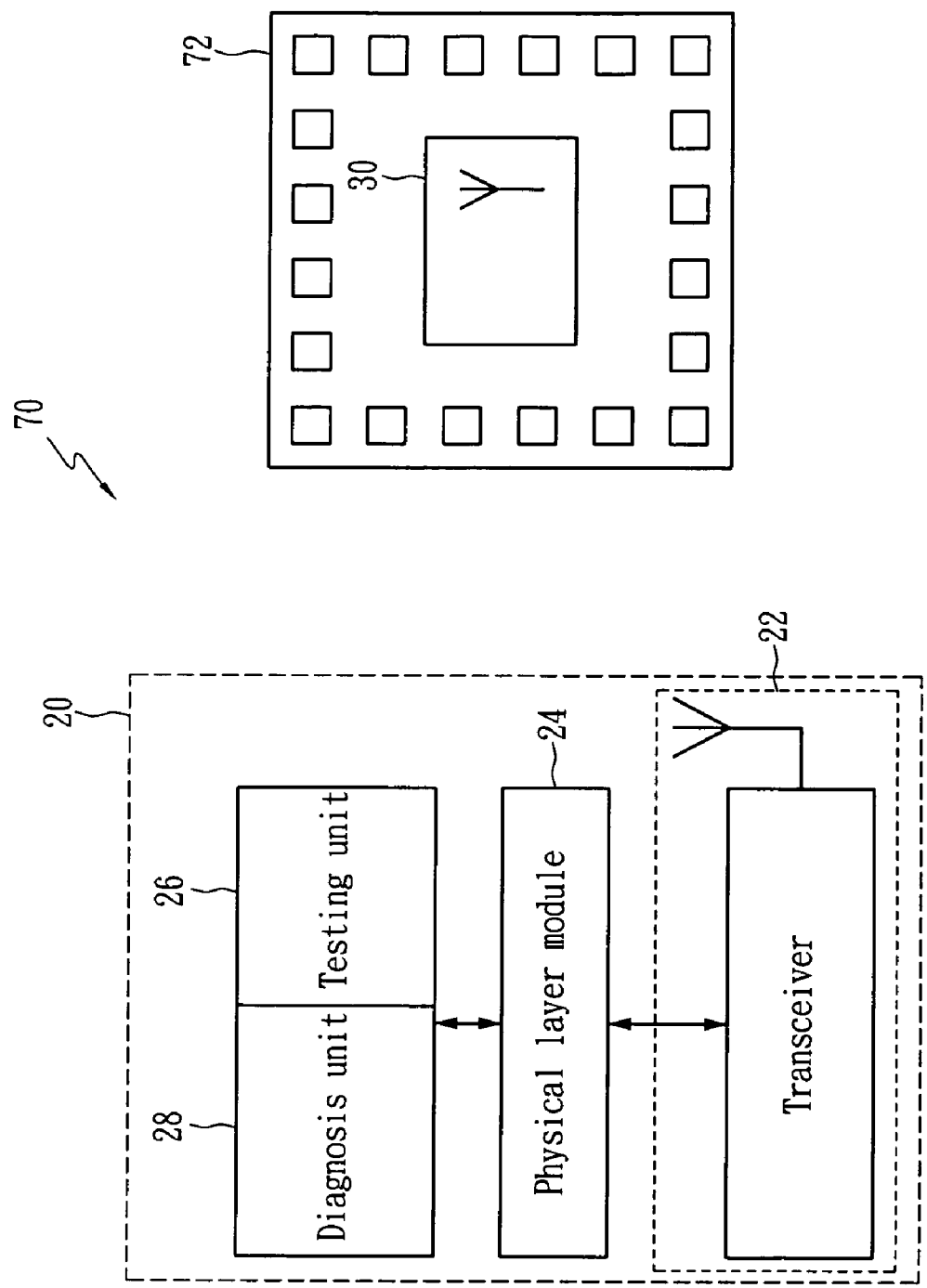
FIG. 3 is a schematic illustration of a probing system for the integrated circuit device according to the third embodiment of the present invention.

FIG. 3 illustrates a probing system 70 for an integrated circuit device according to the third embodiment of the present invention, which is applied to the final testing of an encapsulated die 72. As shown in FIG. 2, the wafer 90 is cut into a plurality of integrated circuit devices 30. Those which meet electrical properties specifications are selected to perform the subsequent packaging process, while others that do not meet the specifications are discarded. The testing unit 26 transmits an activation instruction to the second transceiving module 32 to activate the BIST circuit 34 to perform the electrical testing of the core circuit 32. The diagnosis unit 28 then accumulates testing data transmitted from each integrated circuit device 30 after the electrical testing is completed and checks if the integrated circuit device 30 meets the specifications of the electrical properties and analyzes the failure cause of any failed device.

Figure 4:
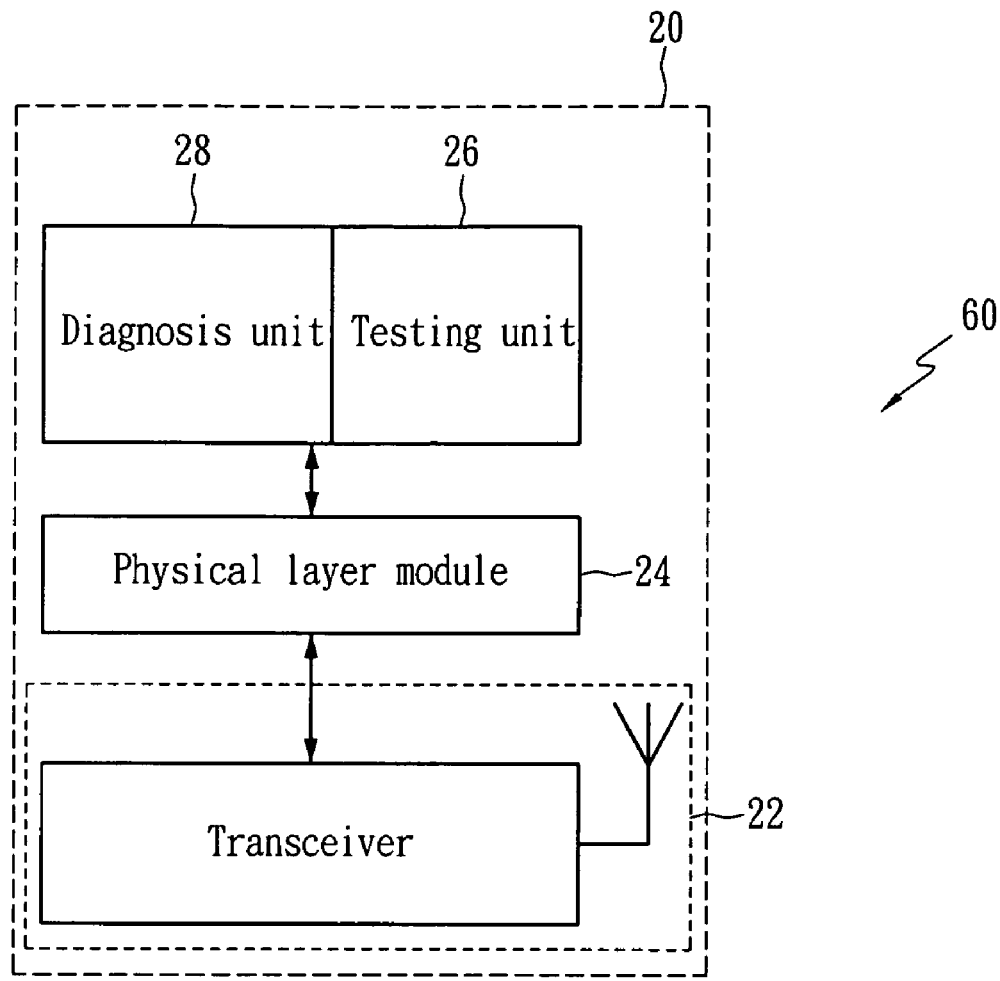
FIG. 4 is a schematic illustration of a probing system for the integrated circuit device according to the fourth embodiment of the present invention.
Figure 4:
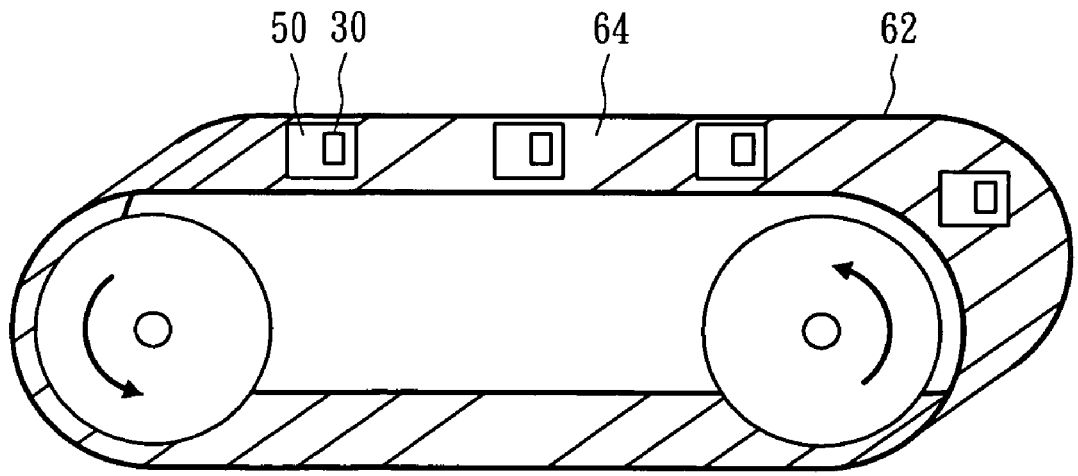

FIG. 4 illustrates a probing system 60 for the integrated circuit device according to the fourth embodiment of the present invention. The testing machine 20 further comprises a conveying device 62 electrically connected to a power supply. The integrated circuit device 30 is positioned on circuit board 50, which is electrically connected to the power supply via the conveying device 62. The integrated circuit device 30 acquires the operation power from the circuit board 50, i.e., from the conveying device 62 via the circuit board 50. The conveying device 62 can convey the circuit board 50 with the integrated circuit device 30 to a predetermined position 64, where the testing unit 26 transmits an activation instruction to the second transceiving module 32 to activate the BIST circuit 34 to perform the electrical testing of the core circuit 32. Subsequently, the diagnosis unit 28 can accumulate testing data transmitted from each integrated circuit device 30 after the electrical testing is completed and checks if the integrated circuit device 30 meets the specifications of the electrical properties and analyze the failure cause of any failed device.

The probing system 10 shown in FIG. 1 could be modified by changing arrangements of the internal modules or devices, so as to increase the flexibility for various applications.

Figure 5:
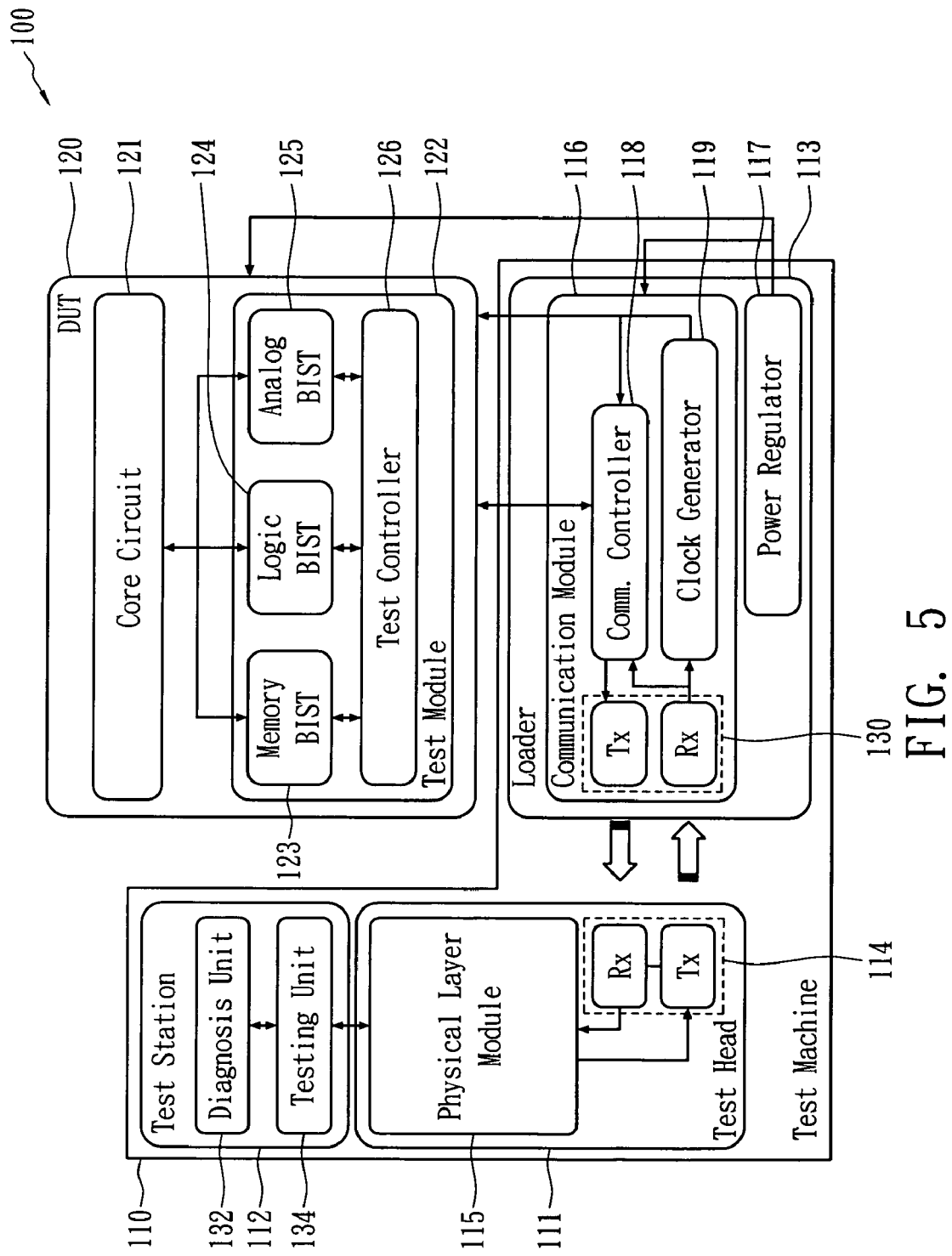
FIG. 5 is a schematic illustration of a probing system for the integrated circuit device according to the fifth embodiment of the present invention.

FIG. 5 illustrates a probing system 100 for an integrated circuit device according to the fifth embodiment of the present invention. The probing system 100 comprises a test machine 110 and an integrated circuit device 120 under test (DUT). The test machine 110 comprises a test head 111, a test station 112 and a loader 113. The test station 112 comprises a diagnosis unit 132 and a testing unit 134, wherein the diagnosis unit 132 is an optional unit to provide diagnosis function. The test head 111 comprises a physical layer module 115 and a first transceiving module 114 coupled to the physical layer module 115. The physical layer module 115 is coupled to the testing unit 134, and the diagnosis unit 132 is coupled to the testing unit 134. The loader 113 is configured to carry the DUT 120, and comprises a communication module 116 and a power regulator 117. The communication module 116 comprises a second transceiving module 130, a communication controller 118.

The communication controller 118 is electrically coupled to the second transceiving module 130, and the clock generator 119 is electrically coupled to the second transceiving module 130, the communication controller 118 and the DUT 120 for providing clock signals. The DUT 120, such as a system on chip (SOC), comprises a core circuit 121 and a test module 122. In one embodiment, the test module 122 comprises a memory BIST (built-in self-test circuit) 123, a logic BIST 124, an analog BIST 125 and a test controller 126. In another embodiment, the test module 122 may comprise a memory BIST (built-in self-test circuit) 123, or a logic BIST 124, or an analog BIST 125 only or it may comprise any combination of two of the above BIST circuits connecting to the test controller 126.

The DUT 120 may be positioned on the loader 113, and acquires the operation power from the loader 113. Moreover, the DUT 120 may be transported to a predetermined position by the conveying device. In one embodiment, the core circuit 121 may comprises a memory circuit, a logic circuit and an analog circuit. The core circuit 121 is coupled to the memory BIST 123, the logic BIST 124 and the analog BIST 125, and the operations of these BISTs are controlled by the test controller 126. In another embodiment, the core circuit 121 may be a memory circuit, or a logic circuit or an analog circuit only, or it may also be any combination of two of the above circuits. The core circuit 121 then is coupled to the corresponding memory BIST 123, the logic BIST 124 or the analog BIST 125. Testing data such as the probing signal and the tested electrical parameter is transmitted between the test head 111 and the loader 113 through the first transceiving module 114 and the second transceiving module 130 in a wireless manner. In other words, the first transceiving module 114 and the second transceiving module 130 exchange testing data with each other. The physical layer module 115 and communication controller 118 controls the transmitting and receiving of data signals respectively.

In an embodiment, the first transceiving module 114 and the second transceiving module 130 each include a transceiver and an antenna. The power regulator 117 is electrically connected to the communication module 116 and the DUT 120. The testing machine 110 transmits a radio frequency signal by the first transceiving module 114, and the second transceiving module 130 receives the radio frequency signal to drive the power regulator 117 to generate the operation power for the DUT 120.

Figure 6:
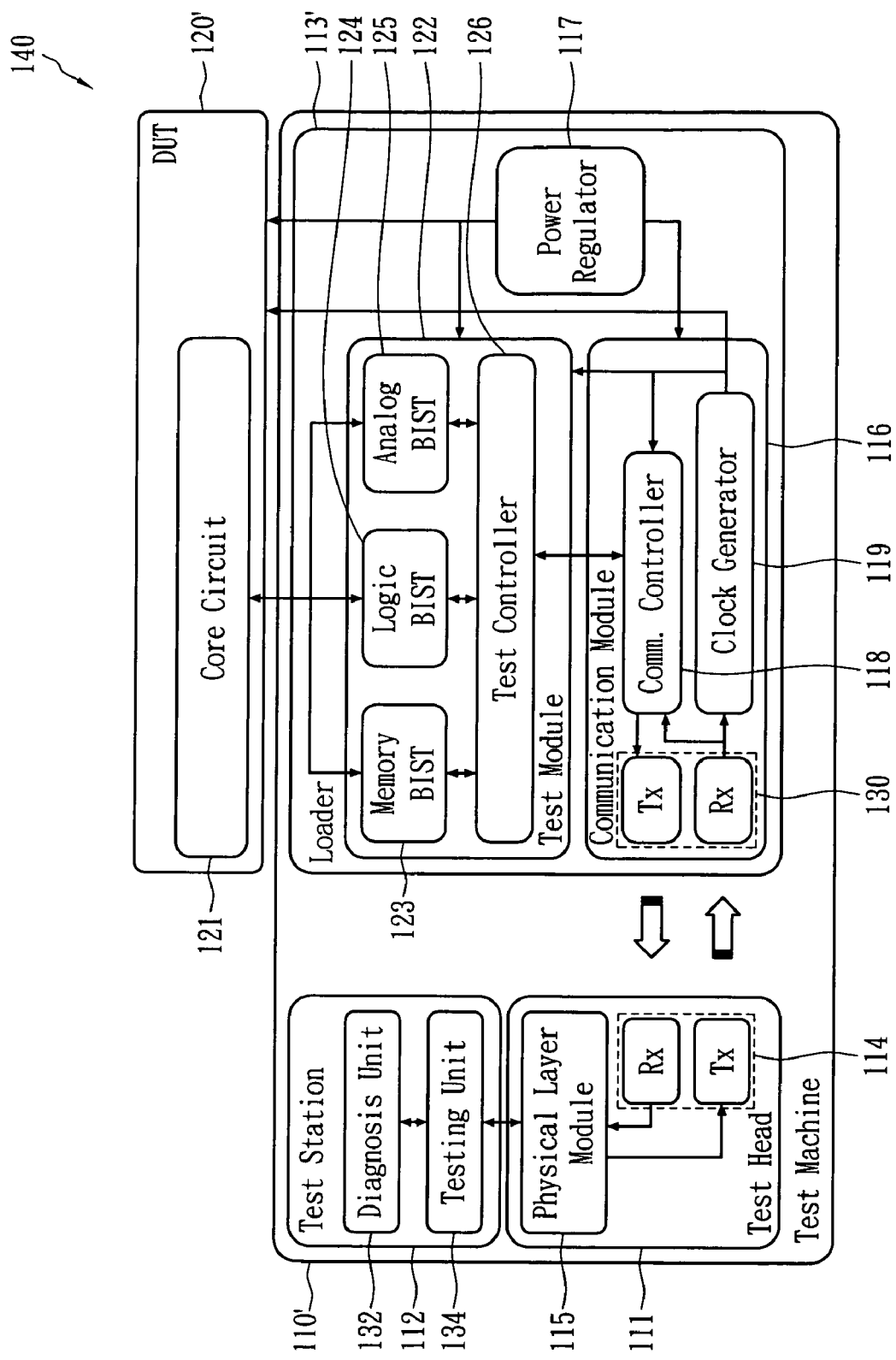
FIG. 6 is a schematic illustration of a probing system for the integrated circuit device according to the sixth embodiment of the present invention.

FIG. 6 illustrates a probing system 140 for the integrated circuit device according to the sixth embodiment of the present invention. In comparison with the system 100 of FIG. 5, the test module 122 is changed to be included in a loader 113' of a test machine 110'. Consequently, a DUT 120' comprises the core circuit 121 only, and is easy to be manufactured. The power regulator is electrically connected to the communication module 116, the test module 122 and the DUT 120'.

Figure 7:
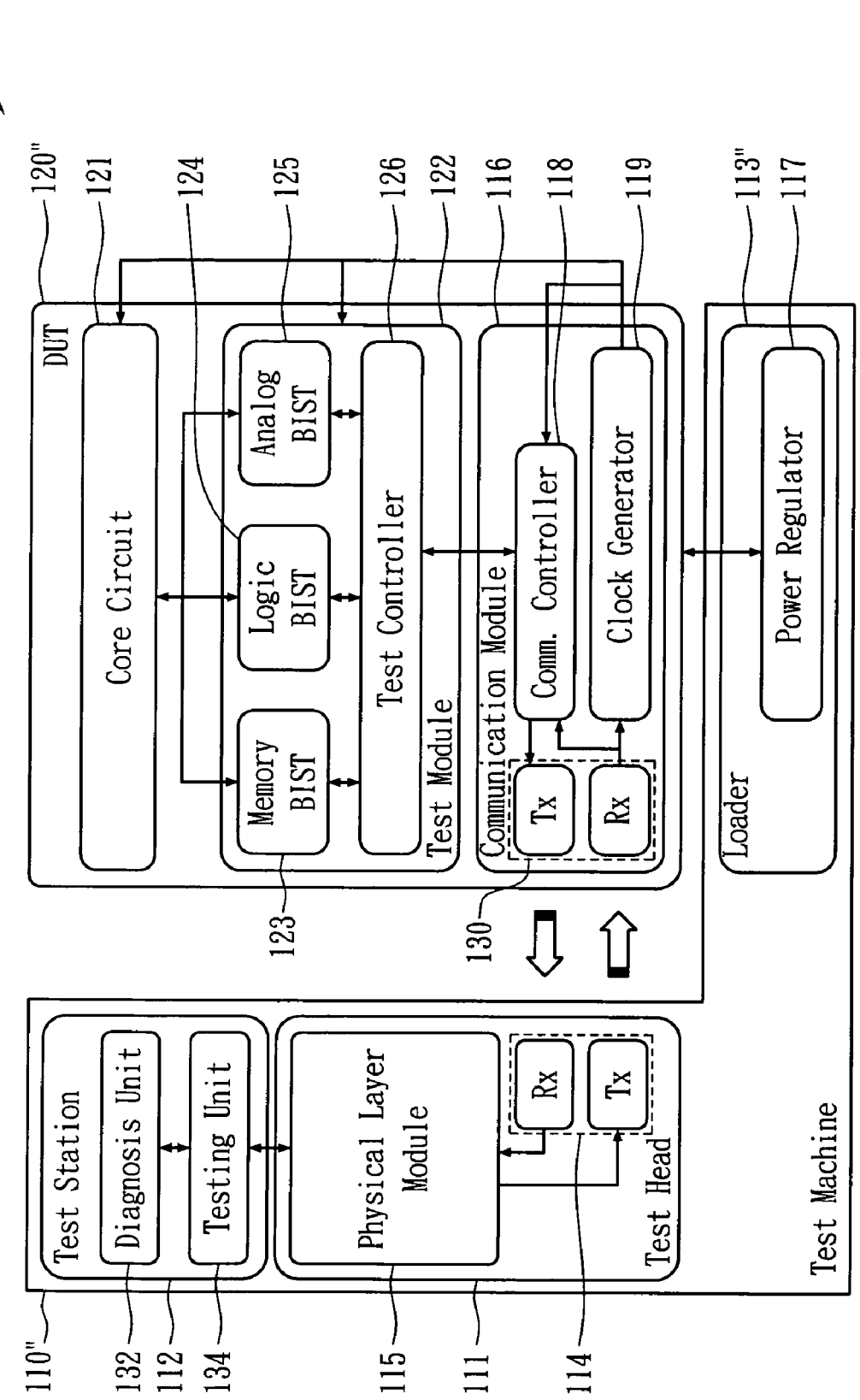
FIG. 7 is a schematic illustration of a probing system for the integrated circuit device according to the seventh embodiment of the present invention.

FIG. 7 illustrates a probing system 150 for an integrated circuit device according to the seventh embodiment of the present invention. In comparison with FIG. 5, the communication module 116 is changed to be included in a DUT 120". Consequently, the DUT 120" comprises the core circuit 121, the test module 122 and the communication module 116, and a loader 113" of a test machine 110" contains the power regulator 117 only. The power regulator 117 is electrically connected to the DUT 120".

Figure 8:
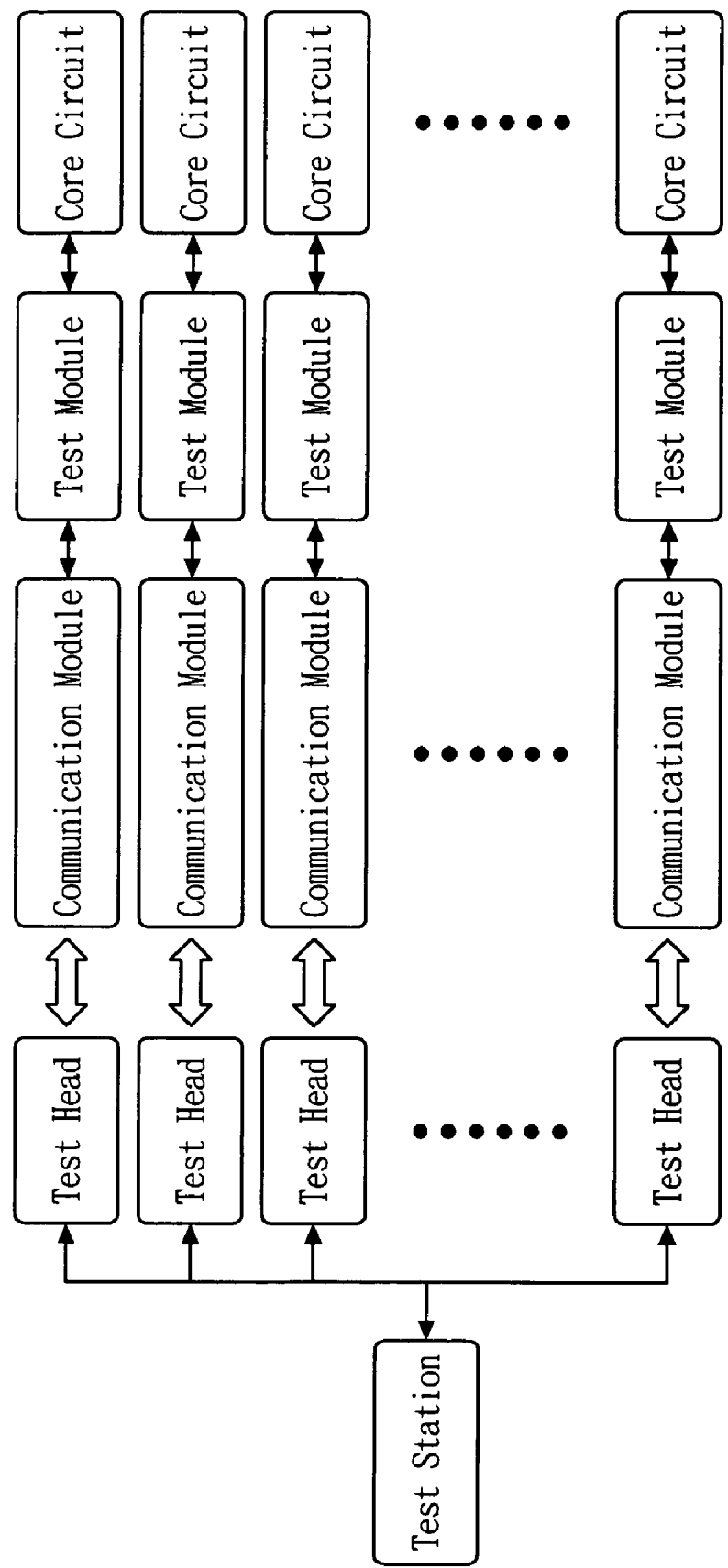
FIGS. 8 and 9 are schematic illustrations of signal transmissions of a probing system for the integrated circuit device according to exemplary embodiments of the present invention.

FIG. 8 illustrates signal transmission for a probing system capable of testing a plurality of DUTs in accordance with one embodiment of the present invention. The test machine comprises a test station and a plurality of test heads and each test head is corresponding to a communication module. The testing data such as the probing signal and the tested electrical parameter is transmitted between the test heads and the communication modules in wireless manner. That is, the communication is conducted by a one-to-one manner. Each communication module is electrically coupled to a test module that is connected to a core circuit. Because there are many test heads, the testing efficiency can be improved significantly.

Figure 9:
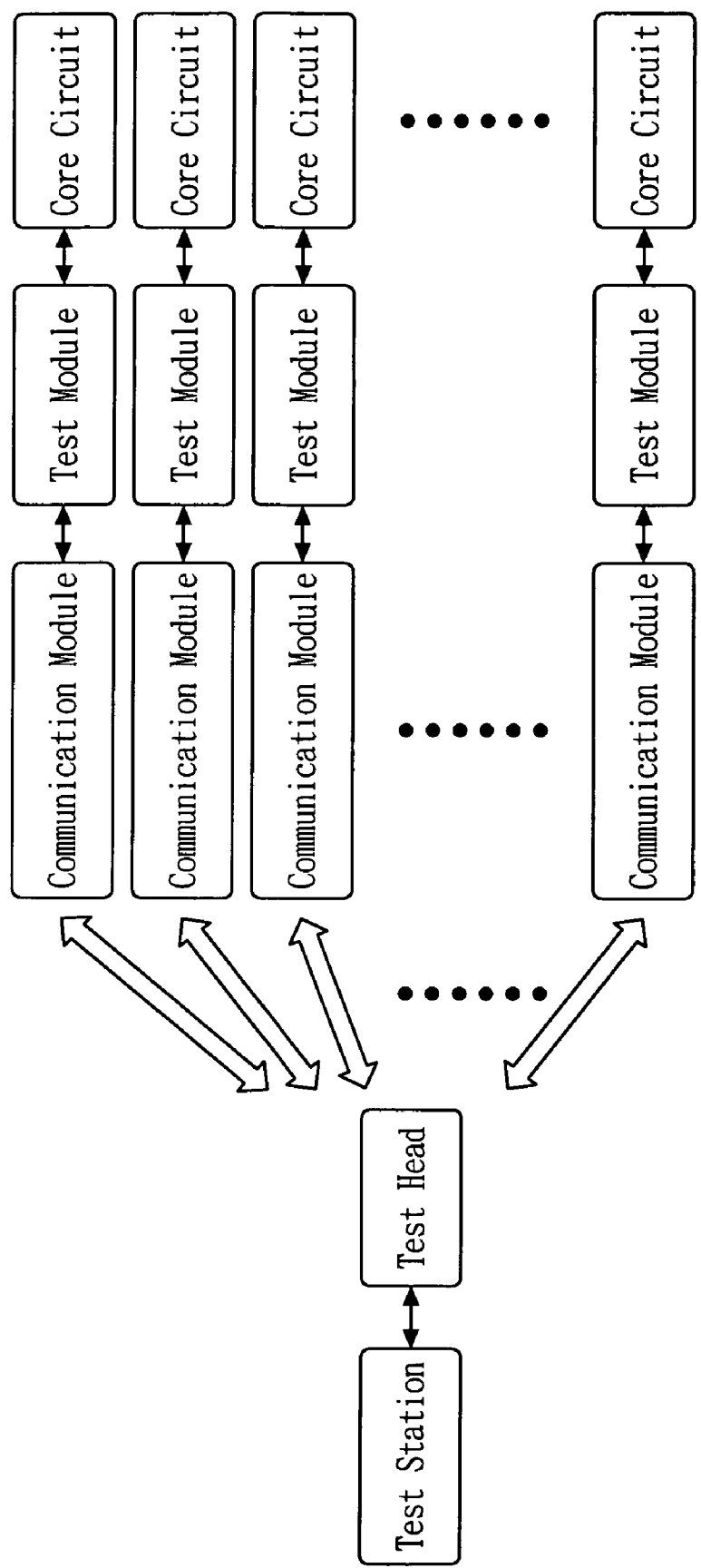

FIG. 9 illustrates signal transmission for a probing system capable of testing a plurality of DUTs in accordance with another embodiment of the present invention. The test machine comprises a test station and a test head, and the test head is corresponding to a plurality of communication modules. Testing data such as the probing signal and the tested electrical parameter is transmitted between the test head and a plurality of communication modules in wireless manner. That is, the communication is conducted by a one-to-multiple manner. Each communication module is electrically coupled to a test module that is electrically connected to a core circuit.

The prior art uses a mechanical element, i.e., the tip, to transmit testing data, and therefore the overall time accuracy cannot catch up with the increasing operation speed of integrated circuit device. Conversely, the present probing system includes a transceiving module in the integrated circuit device to transmit testing data in a wireless manner; therefore the overall time accuracy is substantially the same as that of the integrated circuit device. In other words, the overall time accuracy of the present invention is not restricted by mechanical elements, and therefore can be applied to the electrical testing of high-speed integrated circuit device. Particularly, the present probing system for integrated circuit devices may also diagnose the failure causes of a failed device in addition to performing electrical testing.

The above-described embodiments of the present invention are intended to be illustrative only. Numerous alternative embodiments may be devised by those skilled in the art without departing from the scope of the following claims.

We claim:

1. A probing system for integrated circuit device, comprising:
   a test head having a first transceiving module;
   a test station having a test unit coupled to the test head to perform a test operation;
   a communication module having a second transceiving module configured to exchange data with the first transceiving module in a wireless manner;
   an integrated circuit device having a core circuit being tested; and
   a test module having a self-test circuit coupled to the core circuit and the communication module for performing self-testing to the core circuit.

2. The probing system for integrated circuit device of claim 1, wherein the integrated circuit device further comprises a tag register to store an identification.

3. The probing system for integrated circuit device of claim 1, further comprising:
   a clock generator coupled to the second transceiving module.

4. The probing system for integrated circuit device of claim 3, wherein the communication module further comprises a communication controller coupled to the second transceiving module and the clock generator.

5. The probing system for integrated circuit device of claim 3, wherein the clock generator is coupled to the test module.

6. The probing system for integrated circuit device of claim 3, wherein the integrated circuit device comprises the clock generator.

7. The probing system for integrated circuit device of claim 1, further comprising:
   a power regulator coupled to the communication module, test module and the integrated circuit device, the test unit initiating the transmission of a radio frequency signal by the first transceiving module, the second transceiving module receiving the radio frequency signal to drive the power regulator to generate operation power for the integrated circuit device.

8. The probing system for integrated circuit device of claim 1, further comprising:
   a conveying device, and the integrated circuit device being transported to a predetermined position by the conveying device.

9. The probing system for integrated circuit device of claim 1, wherein the test head further comprises a physical layer module coupled to the first transceiving module.

10. The probing system for integrated circuit device of claim 1, wherein the test station further comprises a diagnosis unit coupled to the testing unit.

11. The probing system for integrated circuit device of claim 1, wherein the core circuit comprises a memory circuit and wherein the test module comprises a memory self-test circuit.

12. The probing system for integrated circuit device of claim 1, wherein the core module comprises a logic circuit and the test module comprises a logic self-test circuit.

13. The probing system for integrated circuit device of claim 1, wherein the core module comprises an analog circuit and the test module comprises an analog self-test circuit.

14. The probing system for the integrated circuit device of claim 1, further comprising:
- at least one test head;
- a plurality of communication modules capable of communicating with the at least one test head in a wireless manner;
- a plurality of test modules coupled to the plurality of communication modules individually; and
- a plurality of integrated circuit devices, each of the integrated circuit device having a core circuit and the core circuit of the plurality of integrated circuit devices being individually coupled to the plurality of test modules.

15. The probing system for integrated circuit device of claim 14, wherein one test head communicates with one or more communication modules.

16. The probing system for integrated circuit device of claim 7, wherein the integrated circuit device comprises the power regulator.

17. The probing system for integrated circuit device of claim 7, wherein the integrated circuit device is positioned on a loader having the power regulator, acquiring operation power from the loader.

18. The probing system for integrated circuit device of claim 17, wherein the integrated circuit device comprises the communication module and the test module.

19. The probing system for integrated circuit device of claim 17, wherein the loader comprises the communication module.

20. The probing system for integrated circuit device of claim 19, wherein the loader comprises the test module.

21. The probing system for integrated circuit device of claim 19, wherein the integrated circuit device comprises the test module.

* * * * *